(12) United States Patent
Downey

(10) Patent No.: US 9,250,862 B2
(45) Date of Patent: Feb. 2, 2016

(54) METHOD AND SYSTEM OF IMPROVED REED-SOLOMON DECODING

(71) Applicant: Walter J. Downey, Los Gatos, CA (US)

(72) Inventor: Walter J. Downey, Los Gatos, CA (US)

(73) Assignee: Echelon Corporation, San Jose, CA (US)

( * ) Notice: Subject to any disclaimer, the term of this patent is extended or adjusted under 35 U.S.C. 154(b) by 268 days.

(21) Appl. No.: 13/842,651

(22) Filed: Mar. 15, 2013

(65) Prior Publication Data
US 2014/0280423 A1 Sep. 18, 2014

(51) Int. Cl.
G06F 7/72 (2006.01)
H03M 13/13 (2006.01)

(52) U.S. Cl.
CPC ............... G06F 7/724 (2013.01); H03M 13/13 (2013.01)

(58) Field of Classification Search
None
See application file for complete search history.

(56) References Cited

U.S. PATENT DOCUMENTS

| 4,251,875 | A | * | 2/1981 | Marver et al. | 708/492 |
| 6,026,420 | A | * | 2/2000 | DesJardins et al. | 708/492 |
| 6,219,815 | B1 | * | 4/2001 | DesJardins et al. | 714/781 |
| 2006/0080376 | A1 | * | 4/2006 | Zhang et al. | 708/492 |
| 2014/0280423 | A1 | * | 9/2014 | Downey | 708/492 |

* cited by examiner

Primary Examiner — David H Malzahn
(74) Attorney, Agent, or Firm — Nicholson De Vos Webster & Elliot LLP

(57) ABSTRACT

Embodiments of an improved Galois multiplication route are described. In some embodiments, the Galois multiplication routine looks up and retrieves a first value corresponding to an address in the Galois table, exclusive ORs the retrieved value with a data value from a data set to generate an intermediate address for the Galois table, wherein the data value is at a location associated with an index, and looks up and retrieves a second value in the Galois table by the intermediate address.

17 Claims, 6 Drawing Sheets

| | |
|---|---|
| Dim D[3]={6,7,3} | ; assume this is filled with 3 data nibbles to be processed |
| Load $G_{index}$=4016 | ; starting address for the $a^2$ sub-table , $G_{index}$=4016(FB0) |
| Load $D_{index}$=D | :$D_{index}$ points to first data nibble which is a 6 |
| Do 3 times | ;normally this is done a large number of times for a bigger data set |
| | |
| (1$^{st}$ iteration) | |
| Y=Table[$G_{index}$]=4016 | ;look up Galois product in table -> Table[4016]=4016(FB0) |
| $G_{index}$ =Y Xor *$D_{index}$++ | ; $G_{index}$ =4016(FB0) Xor 6 = 4022(FB6), $D_{index}$=$D_{index}$+1, $D_{index}$ points to 7 |
| | |
| (2$^{nd}$ iteration) | |
| Y=Table[$G_{index}$]=4027 | ;look up Galois product in table -> Table[4022]=4027(FBB) |
| $G_{index}$ =Y Xor *$D_{index}$++ | ; $G_{index}$ =4027(FBB) Xor 7 = 4028(FBC), $D_{index}$=$D_{index}$+1, $D_{index}$ points to 3 |
| | |
| (3$^{rd}$ iteration) | |
| Y=Table[$G_{index}$]=4021 | ;look up Galois product in table -> Table[4028]=4021(FB5) |
| $G_{index}$ =Y Xor *$D_{index}$++ | ; $G_{index}$ =4021(FB5) Xor 3 = 4022(FB6), $D_{index}$=$D_{index}$+1, $D_{index}$ points past data |
| End loop | |
| | |
| Y=Table[$G_{Index}$] =4027 | ;look up Galois product in table -> Table[4022]=4027(FBB) |
| Y=Y & F=11 | ;FBB & F=B mask out address so only data nibble is left, end result is 11 |

Figure 6

METHOD AND SYSTEM OF IMPROVED REED-SOLOMON DECODING

FIELD

The embodiments of the invention are related to the field of Galois arithmetic, especially in the field of Reed-Solomon decoding.

BACKGROUND

The Reed-Solomon code. This code requires special mathematical operations using Galois math (additions and multiplications) operating on a binary extension field. These special multiply operations are not built into standard processors (even if standard multiplication is built in), and to implement these multiplies can require too many processor cycles to be feasible given the desire to minimize coding delays in the system.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 6 illustrates an exemplary calculation using an enhanced table.

DETAILED DESCRIPTION

Figure 1:
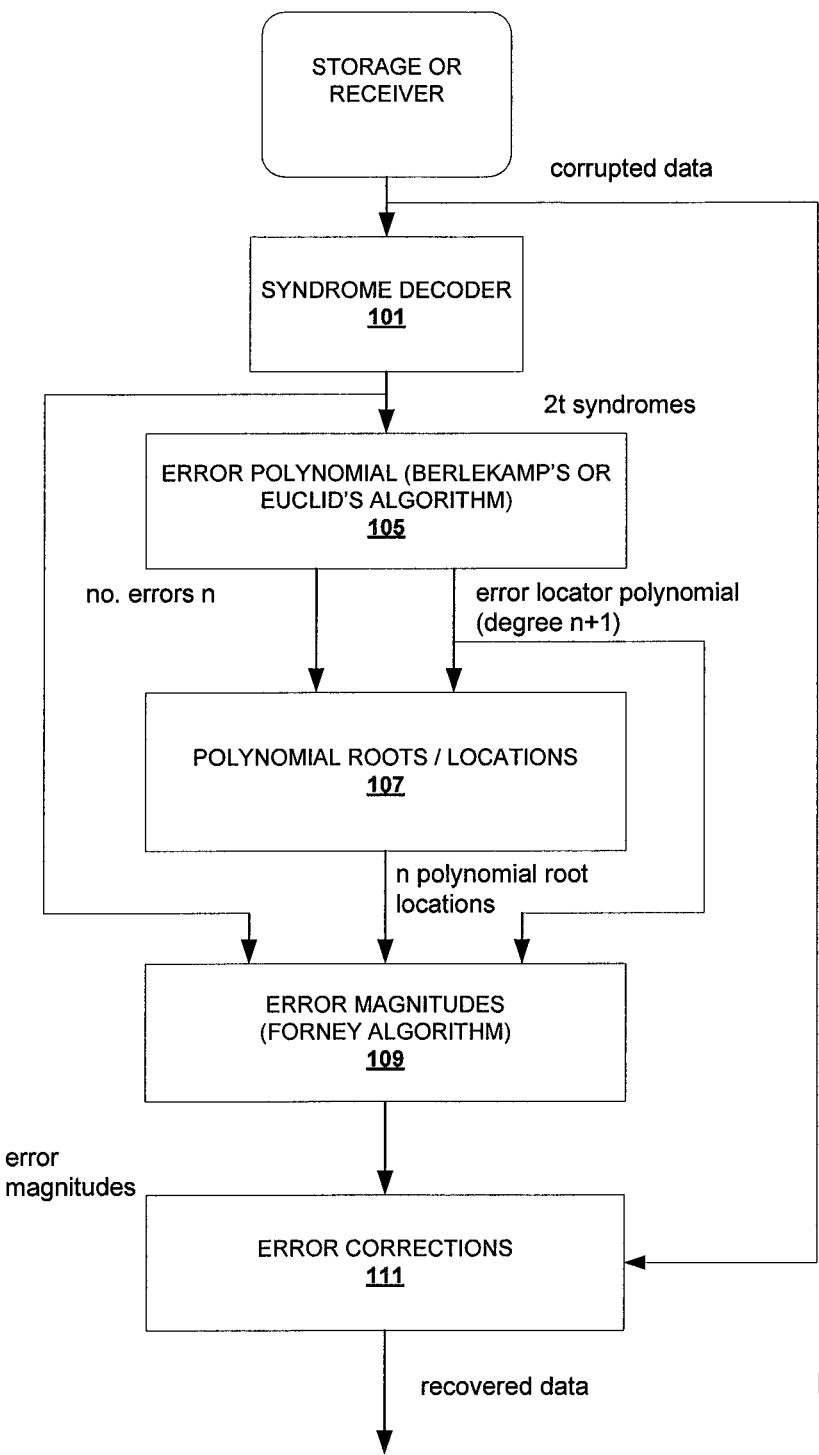
FIG. 1 illustrates the steps of RS decoding.

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated by one skilled in the art that the invention may be practiced without such specific details. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

As noted above, many communications protocols use Reed-Solomon (RS) decoding. On such specification, is the Powerline Communication (PLC) G3 specification. The G3 specification requires implementing a specific RS decoder. FIG. 6 illustrates the block diagram of the G3 OFDM transceiver including its RS decoder. This decoder is computationally intensive mostly because of the Galois math that its implementation entails. Further, the G3 specification has very tight inter-packet gap requirements that put a strict time limit on the how long this computation can take. In lower power processor cores, meeting the inter-packet gap specification and without adding custom Galois computation hardware is challenging.

RS codes are a systematic linear block code. It is a block code because the code is put together by splitting the original message into fixed length blocks. Each block is further sub divided into m-bit symbols. Each symbol is a fixed width, usually 3 to 8 bits wide. In the proposed design, each symbol is 4 bits wide. The multiplications for these Syndrome and Chien search algorithms use a small subset R of the possible elements for one of the multiplicands.

Galois math operates on a finite set of elements closed under the operations of addition and multiplication. The set of elements spans all representable combinations of values for a given binary width. Unfortunately, to span this complete set of elements a binary extension field must be constructed using a primitive polynomial. This has the effect of severely complicating the multiplication operation that must be used in order to satisfy the necessary requirements for operating on a field since it uses polynomial multiplication and reduction instead of the built-in standard multiplication. The standard way to implement Galois multiplication is through the use of a table. The Galois addition operation, on the other hand, is simply an exclusive OR which is supported in hardware by standard processors. The multiplication technique to be described is applicable to binary extension fields of all bit widths, but for the purposes of brevity a width of only 4 bits will be used defining a Galois field known as GF16 which is based on the primitive polynomial $b^4+b+1$.

Figure 2:
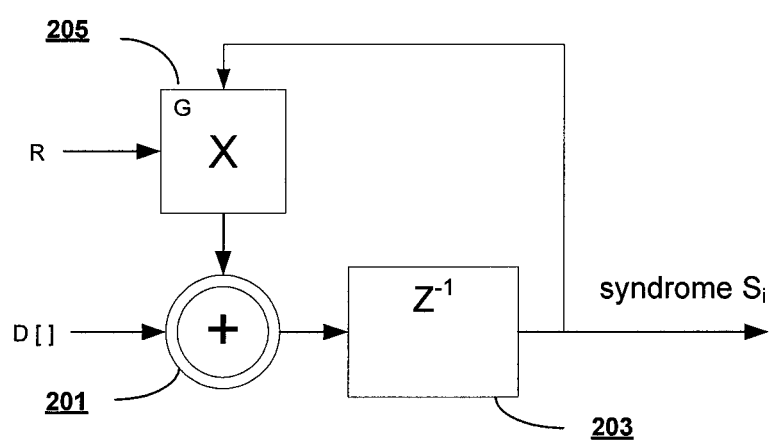
FIG. 2 illustrates an embodiment of a method for Galois multiplication using a Galois table.

FIG. 1 illustrates the steps of RS decoding. The first step of RS decoding of a received symbol is to determine the data syndrome at 101. A diagram of syndrome calculation is shown in FIG. 2. In RS (N=255, k=239, T=8) systematic block code, the syndrome calculation only multiplies by small subset, R, of all of the possible elements for one of the multiplicands. In particular, there are 16 elements R={$\alpha^0$, $\alpha^1$, ..., $\alpha^{15}$} that are used. For this example, the input is 239 elements of received RS encoded data shown as data array D[ ]. This data array is fed one element at a time to an exclusive OR (XOR) Galois accumulator 201 and then to a delay element 203. After a delay imposed by the delay element 203, the accumulated output is fed back around through the Galois multiplier ($^G$X) 205 where it is multiplied by one of the elements in R. The output of the multiplier 205 feeds back into the accumulator 201. In RS decoding, a received symbol is divided by the generator polynomial. If there is a remainder from that division, it is called the syndrome.

The next step of RS decoding is calculating an error polynomial lambda at 103 from the data syndromes. The roots of the lambda define where errors are in the received symbol block. These roots are calculated at 105. One way to do this calculation is through a Chien search.

Next, an error symbol is calculated from the syndromes and error polynomial roots at 107. This is typically done using the Forney algorithm.

The received symbols are correct at 109 by, at each error location, XORing with the error symbol.

Figure 3:
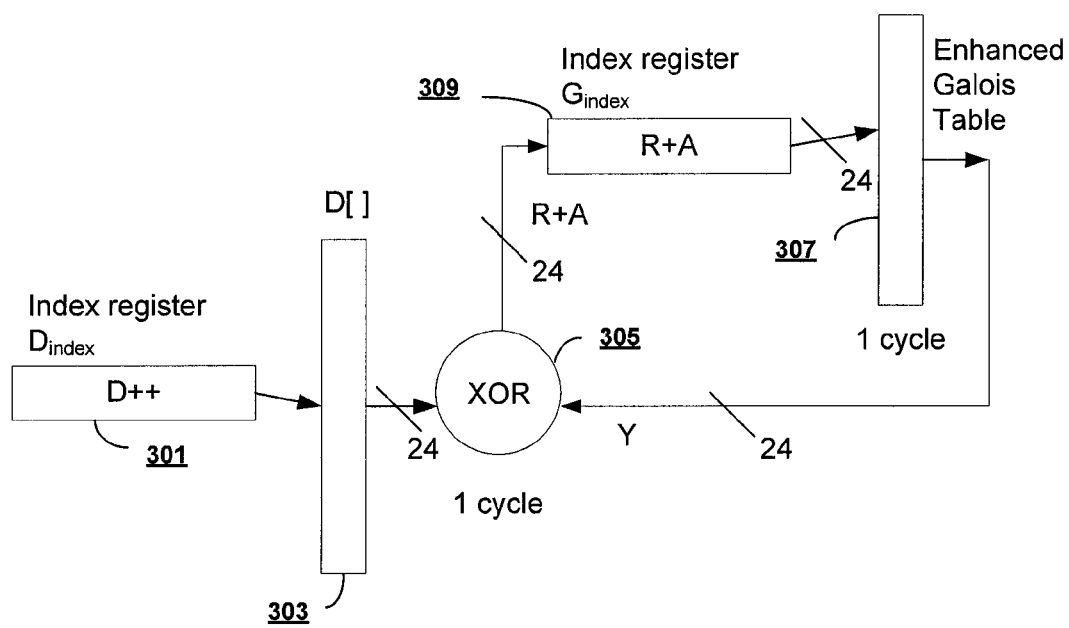
FIG. 3 illustrates an embodiment of Galois multiplication using an enhanced (sub-) table.

FIG. 3 illustrates an embodiment of Galois multiplication using an enhanced (sub-) table. The data set to be multiplied comes from array D[ ] 303. An index register 301 points to the data element to be first multiplied. Each $R_i$ sub-table has a size $2^m$ for $GF(2^m)$ which is enough to hold the $2^m$ possible combinations of these m-tuples where m is the dimension of the field. However, most modern embedded processors have data widths greater than the width of the m-tuple, for instance 16, 24, 32, or 64. Thus, not all of the bits are used as only the least significant m-bits are used in the data path for the calculations. In FIG. 3, both the address bus width and the data path widths are shown to be 24 bits wide even though the Galois calculations only use the lower 8 bits. Furthermore, the Galois addition uses an XOR operation 305 which has the property that it leaves those unused bits unchanged if there are zeros in those bit locations for one of the operands. Instead of storing only the binary form result for the multiplication, the binary result is stored as the lower m bits and an address offset as the upper 16 bits in register 309. In the table the lower m bits of each sub-table are zeros and each address stored has as its lower 8 bits the binary result. Of course, this is merely an example based on 24-bit data path width and the values would change accordingly for different data path widths. Table I below shows such an arrangement for a table in GF16. As such, m is 4 in this table. The values in each column are in decimal format, but may be in other formats. In practice only the value columns are used, the address columns and the bin column are shown for explanatory purposes. The alignment of the start address of each column or sub-table is important. The address must be an integer multiple of $2^m$ which guarantees XORing with the m-bit data does not produce an address outside the current sub-table being used. It further guarantees that the address does not interfere with the data and can be masked out.

TABLE I

| bin | Address *$a^1$ | value *$a^1$ | address *$a^2$ | value *$a^2$ | address *$a^3$ | value *$a^3$ |
|---|---|---|---|---|---|---|
| 0 | 4000 | 4000 | 4016 | 4016 | 4032 | 4032 |
| 1 | 4001 | 4002 | 4017 | 4020 | 4033 | 4040 |
| 2 | 4002 | 4004 | 4018 | 4024 | 4034 | 4035 |
| 3 | 4003 | 4006 | 4019 | 4028 | 4035 | 4043 |
| 4 | 4004 | 4008 | 4020 | 4019 | 4036 | 4038 |
| 5 | 4005 | 4010 | 4021 | 4023 | 4037 | 4046 |
| 6 | 4006 | 4012 | 4022 | 4027 | 4038 | 4037 |
| 7 | 4007 | 4014 | 4023 | 4031 | 4039 | 4045 |
| 8 | 4008 | 4003 | 4024 | 4022 | 4040 | 4044 |
| 9 | 4009 | 4001 | 4025 | 4018 | 4041 | 4036 |
| 10 | 4010 | 4007 | 4026 | 4030 | 4042 | 4047 |
| 11 | 4011 | 4005 | 4027 | 4026 | 4043 | 4039 |
| 12 | 4012 | 4011 | 4028 | 4021 | 4044 | 4042 |
| 13 | 4013 | 4009 | 4029 | 4017 | 4045 | 4034 |
| 14 | 4014 | 4015 | 4030 | 4029 | 4046 | 4041 |
| 15 | 4015 | 4013 | 4031 | 4025 | 4047 | 4033 |

Each sub-table is created by first producing a set of $2^m$ data values that are the result of Galois multiplies of some root $R_i$ by all possible Galois elements in binary form order. Note that there are many valid mappings for representing Galois elements in binary form. Galois elements have a polynomial representation of the form $a_{m-1}p^{m-1} + a_{m-2}p^{m-2} + \ldots a_0p^0$ where $a_m$ are binary coefficients. The example in table I represents the Galois elements by associating particular bit locations in the binary value with coefficients of a certain order in the polynomial representation of the Galois element. The order chosen is that the right most bit (lsb) represents the coefficient of the lowest order polynomial term of power 0. Then second bit from the left represents the coefficient of the polynomial term of power 1. This continues for the third bit and polynomial term of power 2 and finally the forth bit from the left representing the coefficient of the polynomial term of power 3. An example binary form mapping for a set of GF16 Galois elements with m=4 is shown in Table II. Other mappings are equally valid but not shown and will result in different values in the sub-tables. The set of $2^m$ binary values are then added to some offset address that must be a multiple of $2^m$. This resulting set representing a sub-table must then be stored starting at that same offset address. It can be seen that many different tables can be created with this method that will work in the present invention as the detailed values are a function of the mapping chosen, the offset chosen and the Galois field chosen.

TABLE II

| polynomial | binary form |
|---|---|
| 0 | 0000 |
| 1 | 0001 |
| p | 0010 |
| p + 1 | 0011 |
| $p^2$ | 0100 |
| $p^2 + 1$ | 0101 |
| $p^2 + p$ | 0110 |
| $p^2 + p + 1$ | 0111 |
| $p^3$ | 1000 |
| $p^3 + 1$ | 1001 |
| $p^3 + p$ | 1010 |
| $p^3 + p + 1$ | 1011 |
| $p^3 + p^2$ | 1100 |
| $p^3 + p^2 + 1$ | 1101 |
| $p^3 + p^2 + p$ | 1110 |
| $p^3 + p^2 + p + 1$ | 1111 |

Table I works because the input data has zeros on the upper bits (such as the upper 16 bits in the example) which, in the enhanced Galois table 307, are used to hold the offset for the particular R element used, and the exclusive OR 305 with zeros preserves that offset, only changing the lower m bits of the looked up word. This is by design of how the Table I is created as described above. The binary form value to be multiplied by is equal to the m least significant bits of the address to be looked up. Once index register $G_{index}$ 309 is loaded with the sub-table offset corresponding to the proper element in R to initialize the calculation, the calculation will remain in that sub-table since the maximum offset of 8 bits is exactly equal to the sub-table size, thus repeatedly multiplying by that $R_i$ element until reinitializing the $G_{index}$ register.

Figure 4:
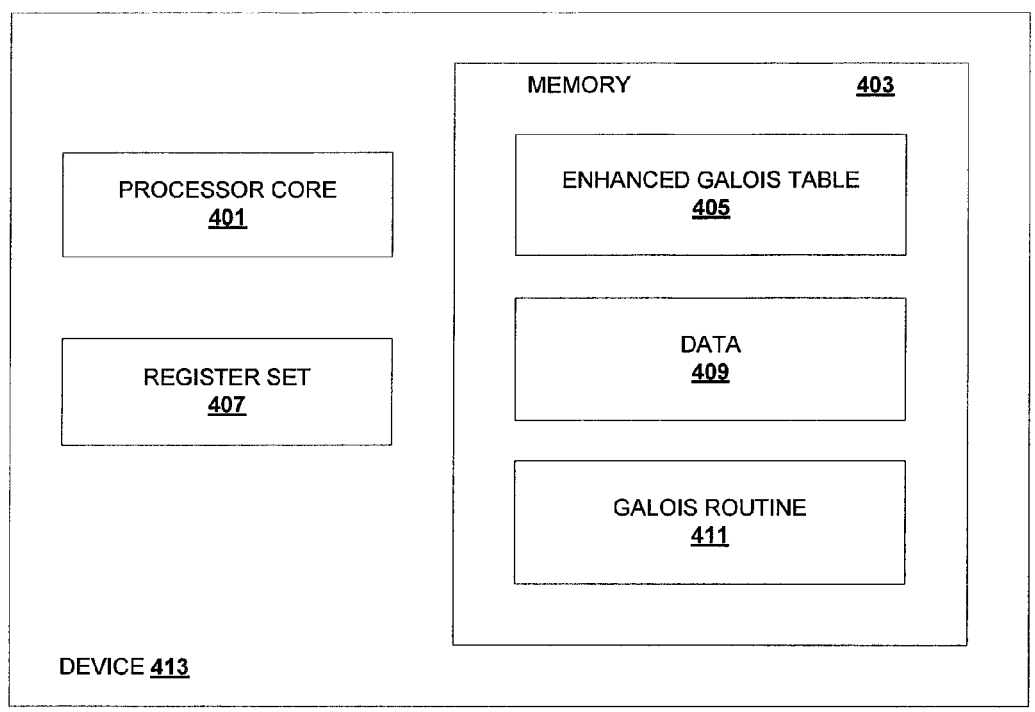
FIG. 4 illustrates an embodiment of a system/device for performing Galois multiplication using an enhanced Galois table.

FIG. 4 illustrates an embodiment of a system/device for performing Galois multiplication using an enhanced Galois table. This system/device 413 may be any type of computing device, however, it is typically one with one or more lower power or performance processor cores 401 that are not capable of natively doing Galois multiplication. As noted above, many modems rely on Galois multiplication and are one type of device that would utilize embodiments of this invention. The system/device 413 includes a register set 407 associated with the processor core(s). These registers may be used to hold index values as such as those in FIG. 3.

The system/device also includes memory 403. Typically, this memory is dynamic (such as DRAM), however, in some embodiments the memory is static (for example, SRAM) or implemented as Read Only Memory (ROM). The memory 403 stores the enhanced Galois table 405, data 409 (such as the data array of FIG. 3), and code to run the Galois multiplication routine 411. Not illustrated is code to perform RS decoding or other routines that utilize Galois multiplication.

Figure 5:
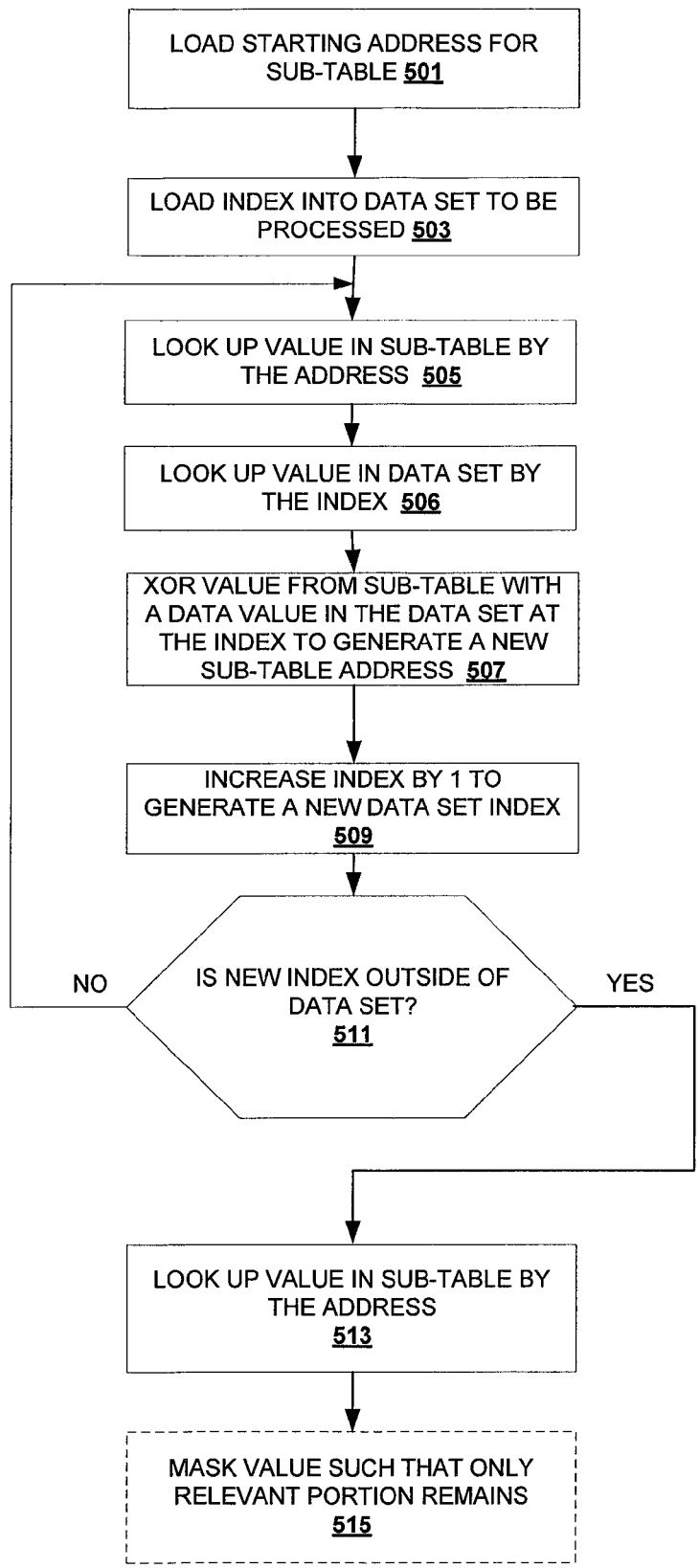
FIG. 5 illustrates an embodiment of a method for Galois multiplication using an enhanced Galois table.

FIG. 5 illustrates an embodiment of a method for Galois multiplication using an enhanced Galois table. While the following description uses a table as its example, the concepts are applicable to sub-tables such as those detailed above. Additionally, the description of this method will refer to an exemplary calculation that is shown in FIG. 6. At 501, a starting address for an enhanced Galois table is loaded. For example, the starting address may be found in index register 309. In the example of FIG. 6, a data set is multiplied by $a^2$ and accumulated. The data set in this example is an array, D, with three values {6, 7, 3}. Hexadecimal equivalents are shown in parenthesis in FIG. 6.

An index value for the starting position in the array to be processed is loaded at 503. In the example of FIG. 6, this would be the index to the first data element of D which would point to D[0]. In terms of FIG. 3, this value would be stored in index register 301.

The index to the starting point in the enhanced Galois table is used to look up and retrieve the data at that index value at 505. In most embodiments, the index value is a memory address to a particular spot of the table. In FIG. 3, the index from register 309 would be used to look up and retrieve a value from the enhanced Galois table 307. Using the example of FIG. 6, a value of 4016 was the starting address for the $a^2$ sub-table and at this address a value of 4016 is stored.

The index to the starting point in the data to be processed is used to look up and retrieve the data at that index value at 506. In FIG. 3, the index from register 301 would be used to look up and retrieve a value from array D at 303. Using the example of FIG. 6, a value of 6 was the initial index into the array.

At the 507, a new index into the table is created by exclusive ORing (XOR) the retrieved data value from enhanced Galois table and the data value from the data set. In the example of FIG. 6, 4016 (FB0 in hex) is XORed with 6 resulting in 4022 (FB6 in hex). In FIG. 3, this would be performed by XOR 305. The result of the XOR is a new index into the enhanced Galois table.

At 509, the index into the data set is increased by 1.

A determination of if the incremented index is outside of the data set is made at 511. For an array, this would simply be a check to see if the incremented index is greater than the array size minus 1 (using the convention of 0 for the beginning of the array). When the index is not outside of the data set, then the method goes back to 505. Alternatively the number of iterations the loop is to be repeated can be predetermined before entering the loop to be equal to the length of the input data and then the step of checking whether the index is outside the data set can be eliminated from the loop as illustrated by the steps in FIG. 6.

When the index is outside of the data set, then a final lookup into the enhanced Galois table is made at 513 using the value from the XOR of 507. In the example of FIG. 6, three pieces of data have been processed from the data set. The final XOR resulted in a value of 4022 (or FB6 in hex). In the sub-table this equates to a value of 4027 (or FBB in hex).

This value is ANDed with a value to mask out the address such that only the data is left. In this case, FBB (hex version) is ANDed with F to get B (hex) as the result.

While the above method has been described in an order, other orders may be used. For example, the order of loading and/or retrieving may be different, etc. Additionally, the above description is processor and instruction set agnostic. In other words, the above method is not tailored to a particular brand or even type of processor. As such, particular instructions to be used are not described.

Different embodiments of the invention may be implemented using different combinations of software, firmware, and/or hardware. Thus, the techniques shown in the figures can be implemented using code and data stored and executed on one or more electronic devices (e.g., an end system, a network element). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device.

While the flow diagrams in the figures herein above show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. An apparatus comprising:
   a processor; and
   a memory to store a Galois table and multiplication routine which when executed by the processor causes the processor to perform actions comprising:
      retrieving a first value corresponding to an address in the Galois table, wherein the Galois table includes at least one sub-table which includes a set of $2^m$ data values that are the result of Galois multiplies of some Galois element by all possible Galois elements in binary form order wherein the binary form represents a consistent ordered mapping of coefficients in the Galois polynomial elements to bit locations in the binary value and wherein the values have an offset address that is a multiple of $2^m$ added to them;

exclusive ORing the retrieved value with a data value from a data set to generate an intermediate address for the Galois table, wherein the data value is at a location associated with an index;

retrieving a second value in the Galois table by the intermediate address.

2. The apparatus of claim 1, wherein the routine further comprises:

masking the second value to leave only a relevant portion.

3. The apparatus of claim 1, further comprising:

prior to looking up and retrieving a second value in the Galois table by the intermediate address, increasing the index by one; and determining that the increased index is outside of the data set.

4. The apparatus of claim 1, wherein the Galois table has sub-tables of size $2^m$, wherein m is a dimension of a Galois field.

5. The apparatus of claim 4, wherein a data path of the processor is greater than m.

6. The apparatus of claim 1, wherein a Galois sub-table has values such that values of the n-m most significant bits are used as an offset address into the table and, values of the m least significant bits are the result of the Galois multiply of a first Galois element by a second Galois element and the storage location of the value is equal to the offset address plus the value of the first Galois element, wherein n is the width of the address bus and m is the dimension of the Galois field.

7. The apparatus of claim 6 wherein the result and Galois elements are the binary forms obtained by a consistent bit mapping of the coefficients of the Galois polynomial to binary numbers.

8. The apparatus of claim 6 wherein the offset address is a multiple of the length of the Galois field.

9. The apparatus of claim 1, wherein the apparatus is a modem.

10. A method of performing Galois multiplication by a processor, the method comprising:

retrieving a first value corresponding to an address in a Galois table stored in memory, wherein the Galois table includes at least one sub-table which includes a set of $2^m$ data values that are the result of Galois multiplies of some Galois element by all possible Galois elements in binary form order wherein the binary form represents a consistent ordered mapping of coefficient in the Galois polynomial elements to bit locations in the binary value and wherein the values have an offset address that is multiple of $2^m$ added to them;

exclusive ORing the retrieved value with a data value from a data set to generate an intermediate address for the Galois table, wherein the data value is at a location associated with an index into the data set;

retrieving a second value in the Galois table by the intermediate address.

11. The method of claim 10, wherein the method further comprises:

masking the second value to leave only a relevant portion.

12. The method of claim 10, further comprising:

prior to looking up and retrieving a second value in the Galois table by the intermediate address, increasing the index by one; and determining that the increased index is outside of the data set.

13. The method of claim 10, wherein the sub-tables are of size $2^m$, wherein m is a dimension of a Galois field.

14. The method of claim 12, wherein a data path of the processor is greater than m.

15. The method of claim 10, wherein the Galois table values are such that values of the most significant bits are used as an offset address into the table and, values of the least significant bits are the result of the Galois multiply of a first Galois element by a second Galois element and the storage location of the value is equal to the offset address plus the value of the first Galois element.

16. The method of claim 15 wherein the result and Galois elements are the binary forms obtained by a consistent bit mapping of the coefficients of the Galois polynomial to binary numbers.

17. The method of claim 15 wherein the offset address is a multiple of the length of the Galois field.

* * * * *